United States Patent
Park

(10) Patent No.: US 8,081,524 B2
(45) Date of Patent: Dec. 20, 2011

(54) COMBO-TYPE SEMICONDUCTOR INTEGRATED CIRCUIT SUPPLIED WITH A PLURALITY OF EXTERNAL VOLTAGES

(75) Inventor: Mun-Phil Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 832 days.

(21) Appl. No.: 11/819,261

(22) Filed: Jun. 26, 2007

(65) Prior Publication Data

US 2008/0037352 A1   Feb. 14, 2008

(30) Foreign Application Priority Data

Aug. 11, 2006   (KR) .................. 10-2006-0076228

(51) Int. Cl.
  *G11C 5/14*   (2006.01)
(52) U.S. Cl. .............. 365/189.09; 365/189.11; 365/227; 365/226; 365/225.7; 327/536; 327/537; 327/535
(58) Field of Classification Search ............. 365/189.11, 365/189.09, 225.7, 227, 228, 226; 327/536, 327/537, 535, 538
See application file for complete search history.

(56) References Cited

U.S. PATENT DOCUMENTS

| | | | | |
|---|---|---|---|---|
| 5,610,863 A | * | 3/1997 | Yamada | 365/189.09 |
| 5,936,911 A | * | 8/1999 | Inaba | 365/233.1 |
| 6,504,783 B2 | | 1/2003 | Jo | |
| 6,876,246 B2 | * | 4/2005 | Kim | 327/536 |
| 6,930,948 B2 | * | 8/2005 | Lee et al. | 365/226 |

FOREIGN PATENT DOCUMENTS

| | | |
|---|---|---|
| JP | 08-031171 | 2/1996 |
| JP | 2002170387 | 6/2002 |
| KR | 10-1999-0049422 | 7/1999 |
| KR | 1020010001583 | 1/2001 |
| KR | 1020040041955 | 5/2004 |
| KR | 1020060104871 | 10/2006 |

* cited by examiner

*Primary Examiner* — Andrew Q Tran
(74) *Attorney, Agent, or Firm* — Venable LLP; Jeffri A. Kaminski

(57) ABSTRACT

A combo semiconductor memory apparatus capable of reducing current and power consumption is provided. The semiconductor memory apparatus includes: a signal generator that generates a voltage control signal according to the level of an external voltage; and a voltage generator that pumps up the level of the external voltage in response to the voltage control signal and outputs the pumped voltage to a high-level voltage output terminal, or supplies the external voltage as a high-level voltage.

14 Claims, 6 Drawing Sheets

COMBO-TYPE SEMICONDUCTOR INTEGRATED CIRCUIT SUPPLIED WITH A PLURALITY OF EXTERNAL VOLTAGES

CROSS-REFERENCE TO RELATED APPLICATION

This application claims the benefit of Korean Patent Application No. 2006-76228, filed on Aug. 11, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a combo semiconductor memory apparatus usable for both mobile DRAMs and general-purpose DRAMs.

2. Related Art

In recent years, combo dynamic random access memories (DRAMs) usable for both mobile DRAMs and general-purpose DRAMS have been proposed to shorten the time required to develop semiconductor memory apparatuses and to appropriately respond to the changes in the semiconductor memory market. The combo DRAM is designed to be supplied with two types of external voltages of 1.8 V and 3.3 V.

Meanwhile, general semiconductor memory apparatuses, such as DRAM, need to be supplied with a high-level voltage VPP for enabling a word line, and the high-level voltage VPP is generated by an external voltage.

For example, when an external voltage VDD of 1.8 V is applied to a semiconductor memory apparatus, the semiconductor memory apparatus performs charge pumping on the external voltage VDD of 1.8 V to generate a high-level voltage VPP. When an external voltage VDD of 3.3 V is applied to a semiconductor memory apparatus, the semiconductor memory apparatus performs charge pumping on the external voltage VDD of 3.3 V and lowers the pumped potential to a target potential to generate a high-level voltage VPP.

Semiconductor memory apparatuses according to the related art are designed to perform charge pumping to generate an internal voltage, such as the high-level voltage VPP, regardless of the level of an external voltage that is input.

Now, a voltage in the range of 3.3 V to 3.5 V is generally used as the high-level voltage VPP. However, even when an external voltage VDD of 3.3V is applied, the semiconductor memory apparatuses perform charge pumping, which results in current and power consumption.

SUMMARY OF THE INVENTION

Embodiments of the present invention provides a combo semiconductor memory apparatus capable of reducing current and power consumption.

According to an embodiment of the present invention, a semiconductor memory apparatus includes: a signal generator that generates a voltage control signal according to the level of an external voltage; and a voltage generator that pumps up the level of the external voltage in response to the voltage control signal and outputs the pumped voltage to a high-level voltage output terminal, or supplies the external voltage as a high-level voltage.

Another embodiment of the present invention provides a combo semiconductor memory apparatus that is selectively supplied with a first external voltage or a second external voltage higher than the first external voltage. The combo semiconductor memory apparatus includes: a signal generator that generates a voltage control signal according to whether an external voltage is the first external voltage or the second external voltage; and a voltage generator that, in response to the voltage control signal, pumps up the level of the first external voltage and outputs the pumped voltage to a high-level voltage output terminal, supplies the second external voltage to the high-level voltage output terminal, or pumps up the level of the second external voltage to keep the potential of the high-level voltage output terminal at a predetermined level.

BRIEF DESCRIPTION OF THE DRAWINGS

The above and other features and advantages of the present invention will become more apparent by describing in detail exemplary embodiments thereof with reference to the attached drawings in which.

DESCRIPTION OF EXEMPLARY EMBODIMENT

Figure 1:
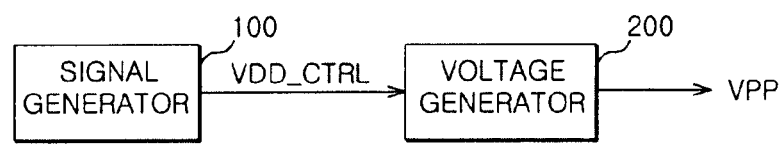
FIG. 1 is a block diagram illustrating a semiconductor memory apparatus according to an embodiment of the present invention.

Embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Referring to FIG. 1, a combo semiconductor memory apparatus according to an embodiment of the present invention includes a signal generator 100 and a voltage generator 200.

The signal generator 100 outputs a voltage control signal VDD_CTRL in response to an external voltage VDD. The voltage generator 200 pumps the external voltage VDD in response to the voltage control signal VDD_CTRL to generate a high-level voltage, or supplies the external voltage VDD as a high-level voltage.

The external voltage VDD is generated from the outside of the semiconductor memory apparatus to operate the semiconductor memory apparatus. This embodiment of the present invention relates to a combo semiconductor memory apparatus supplied with both a voltage of 1.8 V and a voltage of 3.3 V, which are referred to as a first external voltage and a second external voltage, respectively. This embodiment is just illustrative, but the invention is not limited thereto.

Figure 2:
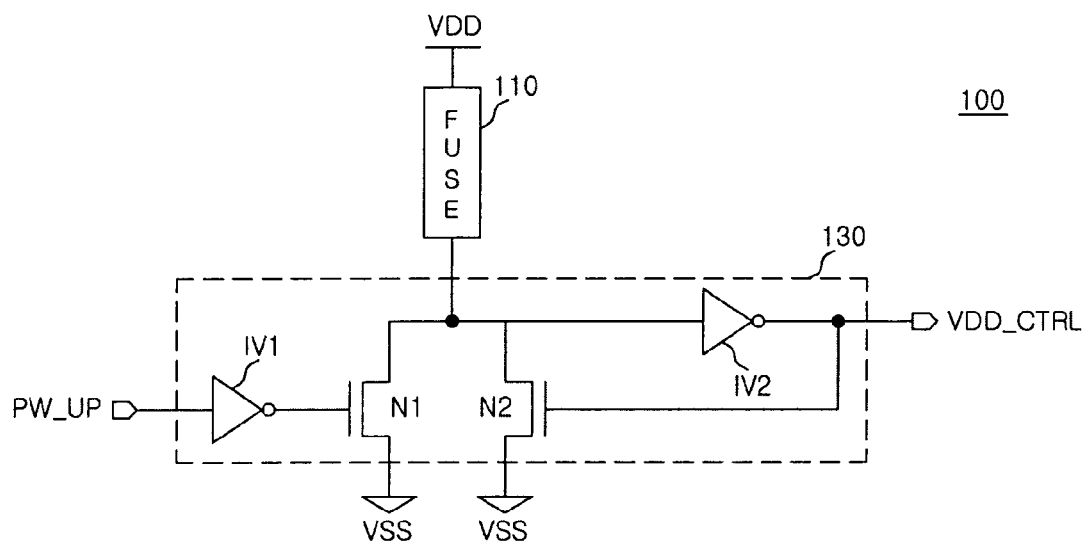
FIG. 2 is a circuit diagram illustrating an example of a signal generator shown in FIG. 1.

As shown in FIG. 2, the signal generator 100 includes a fuse 110 and a signal driving unit 130.

The fuse 110 is blown in response to the external voltage VDD. Preferably, the fuse 110 is blown when a first external voltage VDD1 is input, but it is not blown when a second external voltage VDD2 is input.

The signal driving unit 130 is activated in response to a power-up signal PW_UP and generates the voltage control signal VDD_CTRL in response to the external voltage VDD supplied through the fuse 110. The signal driving unit 130 may be composed of first and second inverting units IV1 and IV2 and first and second NMOS transistors N1 and N2. The first inverting unit IV1 inverts the power-up signal PW_UP, and the second inverting unit IV2 inverts a signal supplied from the fuse 110. The first NMOS transistor N1 may include a gate supplied with an inverted power-up signal /PW_UP, a drain connected to the fuse 110, and a source connected to the ground. The second NMOS transistor N2 may include a gate supplied with an inverted fuse signal, a drain connected to the fuse 110, and a source connected to the ground.

In this embodiment, a change in the level of the power-up signal PW_UP from a low level to a high level will be described as an example. Meanwhile, the level of the power-up signal PW_UP may be changed from a high level to a low level by omitting only the first inverting unit IV1.

Figure 7:
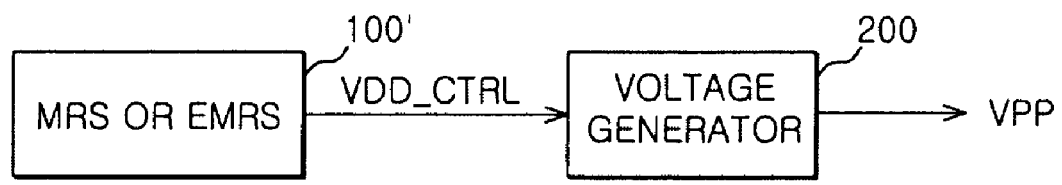
FIG. 7 is a block diagram illustrating a semiconductor memory apparatus according to another embodiment of the present invention.

As shown in FIG. 7, a mode register set (hereinafter, referred to as an MRS) or an extended mode register set (hereinafter, referred to as an EMRS) may be used as the signal generator 100. The MRS identifies the first external voltage VDD1 or the second external voltage VDD2 during the initial operation of a DRAM to determine the level of the voltage control signal VDD_CTRL.

When the MRS or the EMRS is used as the signal generator 100, there may be extra codes used to output the voltage control signal VDD_CTRL, which is a signal for determining whether the external voltage VDD is the first external voltage VDD1 or the second external voltage VDD2. For example, when address No. 9 is the extra code, the level of the voltage control signal VDD_CTRL is determined in response to the address No. 9. In this case, when the first external voltage VDD1 is supplied as the external voltage VDD, the voltage control signal VDD_CTRL changes to a high level. On the other hand, when the second external voltage VDD2 is supplied as the external voltage VDD, the voltage control signal VDD_CTRL changes to a low level.

Figure 3:
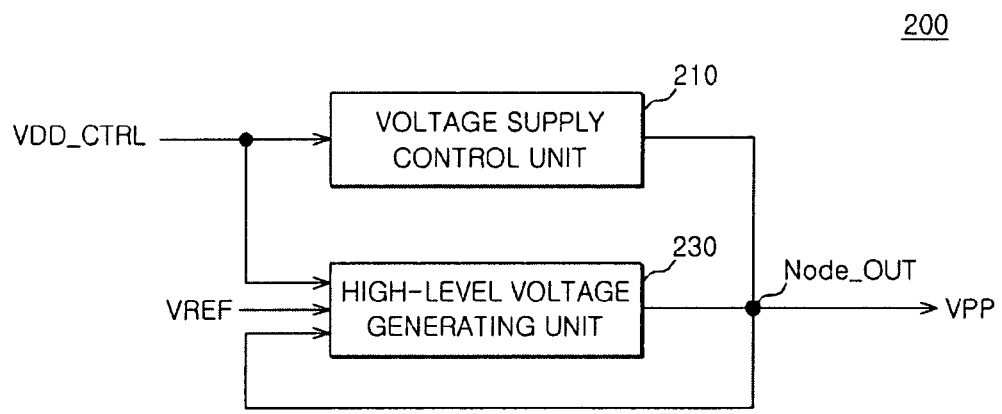
FIG. 3 is a block diagram illustrating a voltage generator shown in FIG. 1.

Referring to FIG. 3, the voltage generator 200 may include a voltage supply control unit 210 and a high-level voltage generating unit 230.

The voltage supply control unit 210 controls the external voltage VDD to be applied to a high-level voltage output terminal Node_OUT in response to the voltage control signal VDD_CTRL.

The high-level voltage generating unit 230 adjusts the boost ratio (for example, the pumping number) of the external voltage VDD in response to the voltage control signal VDD_CTRL, pumps the external voltage VDD, and outputs the pumped voltage to the high-level voltage output terminal Node_OUT. At this point, a high-level voltage VPP is output from the high-level voltage output terminal Node_OUT.

When the external voltage VDD becomes the first external voltage VDD1, the voltage supply control unit 210 is disabled. Therefore, the high-level voltage generating unit 230 of the voltage generator 200 pumps up the level of the first external voltage VDD1, for example, three times to output the pumped voltage to the high-level voltage output terminal Node_OUT.

When the external voltage VDD becomes the second external voltage VDD2, the voltage supply control unit 210 is enabled. Then, in the voltage generator 200, the second external voltage VDD2 is applied to the high-level voltage output terminal Node_OUT through the voltage supply control unit 210 without any change. In this case, when the second external voltage VDD2 is lower than a predetermined target high-level voltage, the high-level voltage generating unit 230 pumps up the level of the second external voltage VDD2, for example, two times to output the pumped voltage to the high-level voltage output terminal Node_OUT, which makes it possible to stably maintain the output level of the high-level voltage VPP.

Figure 4:
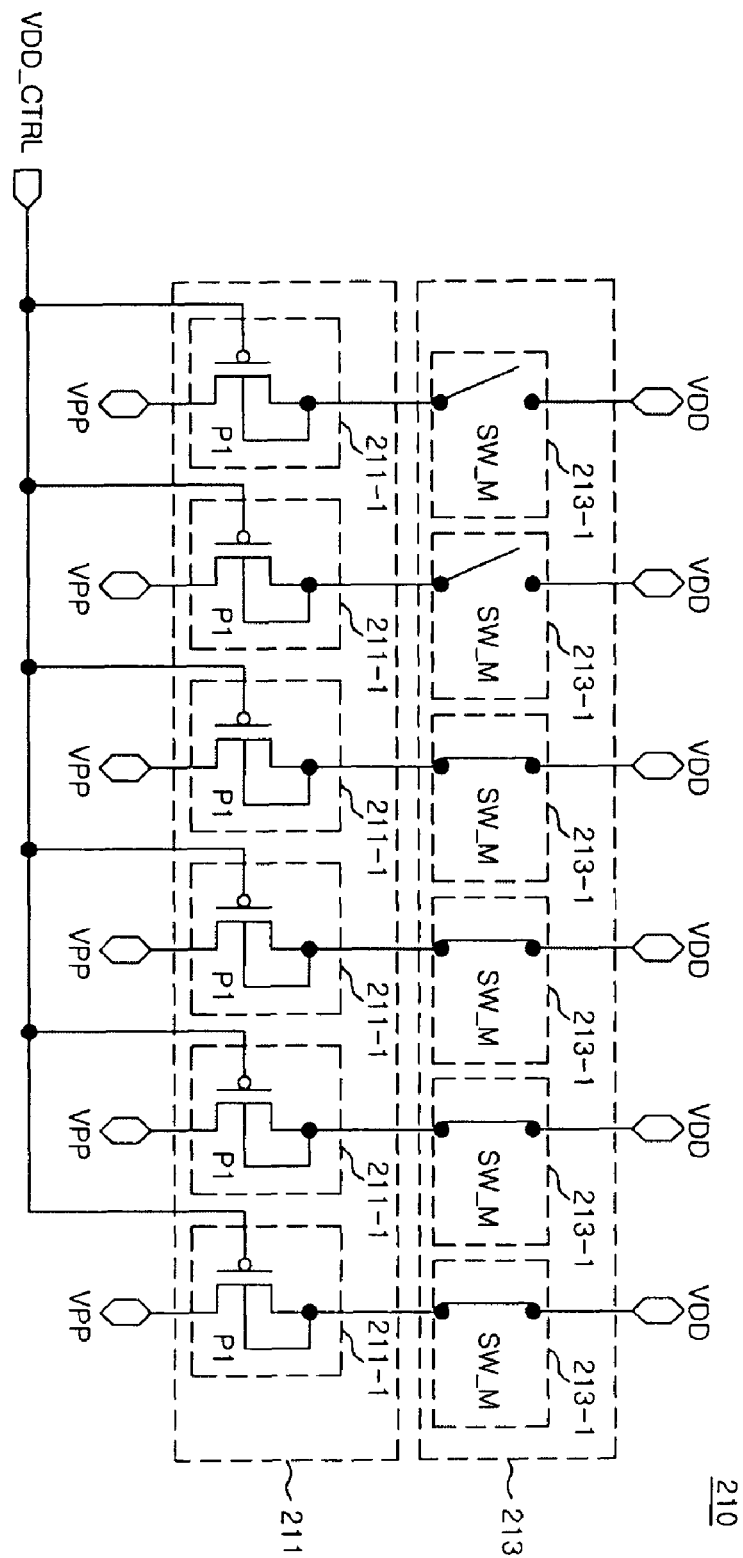
FIG. 4 is a circuit diagram illustrating a voltage supply control unit shown in FIG. 3.

Referring to FIG. 4, the voltage supply control unit 210 includes a switching unit 211 and a current adjusting unit 213. The switching unit 211 supplies the external voltage VDD to the high-level voltage output terminal Node_OUT in response to the voltage control signal VDD_CTRL. The current adjusting unit 213 adjusts the amount of current supplied from an external voltage terminal VDD to the high-level voltage output terminal Node_OUT.

More specifically, the switching unit 211 includes one or more first switching elements 211-1 responding to the voltage control signal VDD_CTRL, and the first switching elements 211-1 are connected to an input terminal of the voltage generator 200 to which the external voltage VDD is applied and the high-level voltage output terminal Node_OUT.

The current adjusting unit 213 includes second switching elements 213-1 corresponding to the first switching elements 211-1. The current adjusting unit 213 adjusts the amount of current supplied from the external voltage terminal VDD to the high-level voltage output terminal Node_OUT according to the on or off states of the second switching elements 213-1.

In this embodiment, PMOS transistors P1 may be used as the first switching elements 211-1, and metal switches SW_M may be used as the second switching elements 213-1.

Figure 8:
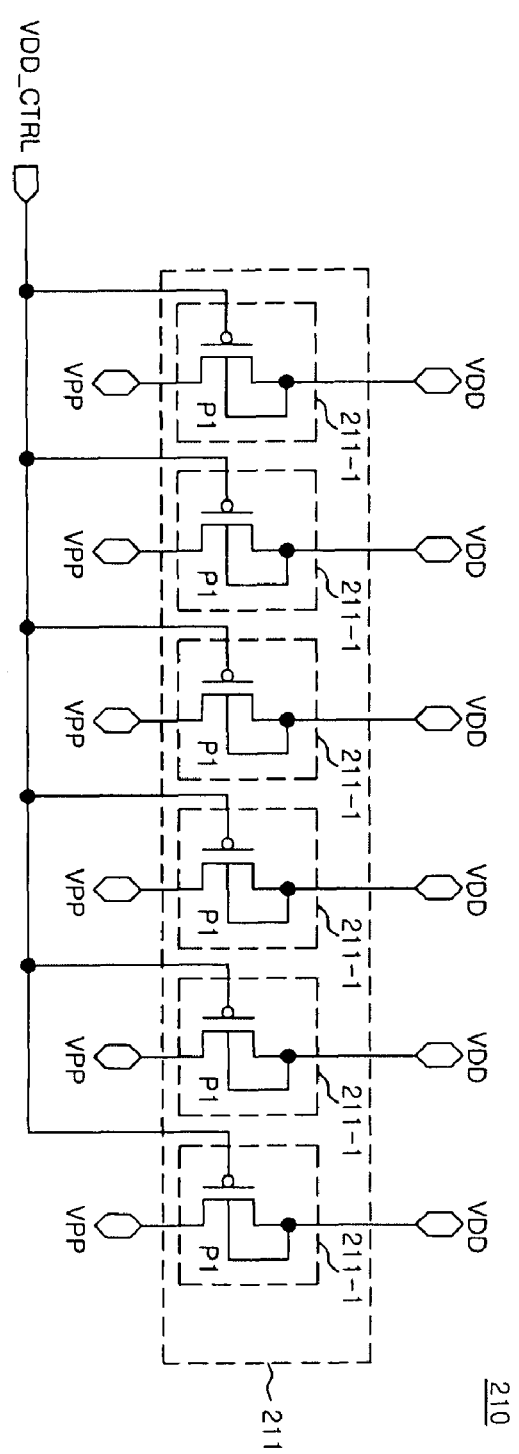
FIG. 8 is a circuit diagram illustrating a voltage supply control unit according to another embodiment of the present invention.

As shown in FIG. 8, the voltage supply control unit 210 may include only the first switching unit 211 connected between the input terminal to which the external voltage VDD is applied and the high-level voltage output terminal Node_OUT.

Figure 5:
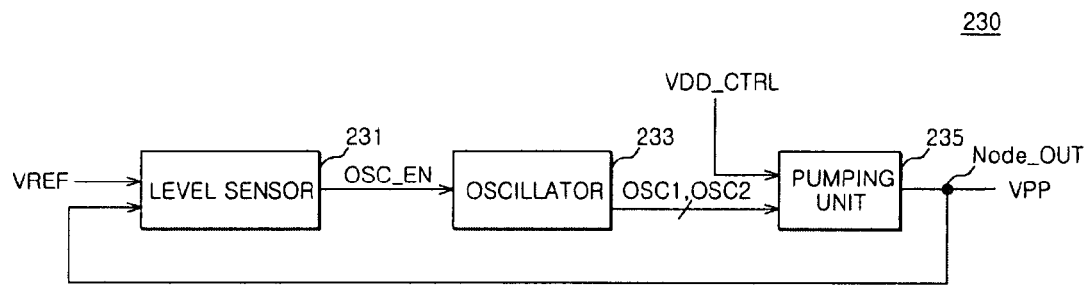
FIG. 5 is a block diagram illustrating a high-level voltage generating unit shown in FIG. 3.

Referring to FIG. 5, the high-level voltage generating unit 230 may include a level sensor 231, an oscillator 233, and a pumping unit 235.

The level sensor 231 compares the level of a reference voltage VREF with the level of the high-level voltage VPP to output an oscillator enable signal OSC_EN. The oscillator 233 outputs oscillation signals OSC1 and OSC2 in response to the oscillator enable signal OSC_EN. The pumping unit 235 adjusts the boost ratio of the external voltage VDD in response to the oscillation signals OSC1 and OSC2 and the voltage control signal VDD_CTRL, pumps the external voltage VDD, and outputs the pumped voltage to the high-level voltage output terminal Node_OUT. In this case, the first and second oscillation signals OSC1 and OSC2 have different active timings.

When the external voltage VDD is the first external voltage VDD1, the pumping unit 235 pumps up the level of the first external voltage VDD1 three times. When the external voltage VDD is the second external voltage VDD2, the pumping unit 235 pumps up the level of the second external voltage VDD2 two times.

Specifically, if the external voltage VDD is the first external voltage VDD1, the pumping unit 235 may use a tripler for pumping up the level of the first external voltage VDD1 three times in response to the voltage control signal VDD_CTRL. If the external voltage VDD is the second external voltage VDD2, the pumping unit 235 may use a doubler for pumping up the level of the second external voltage VDD2 two times to generate the high-level voltage VPP.

The tripler and the doubler are pumps for increasing the external voltage VDD.

Figure 6:
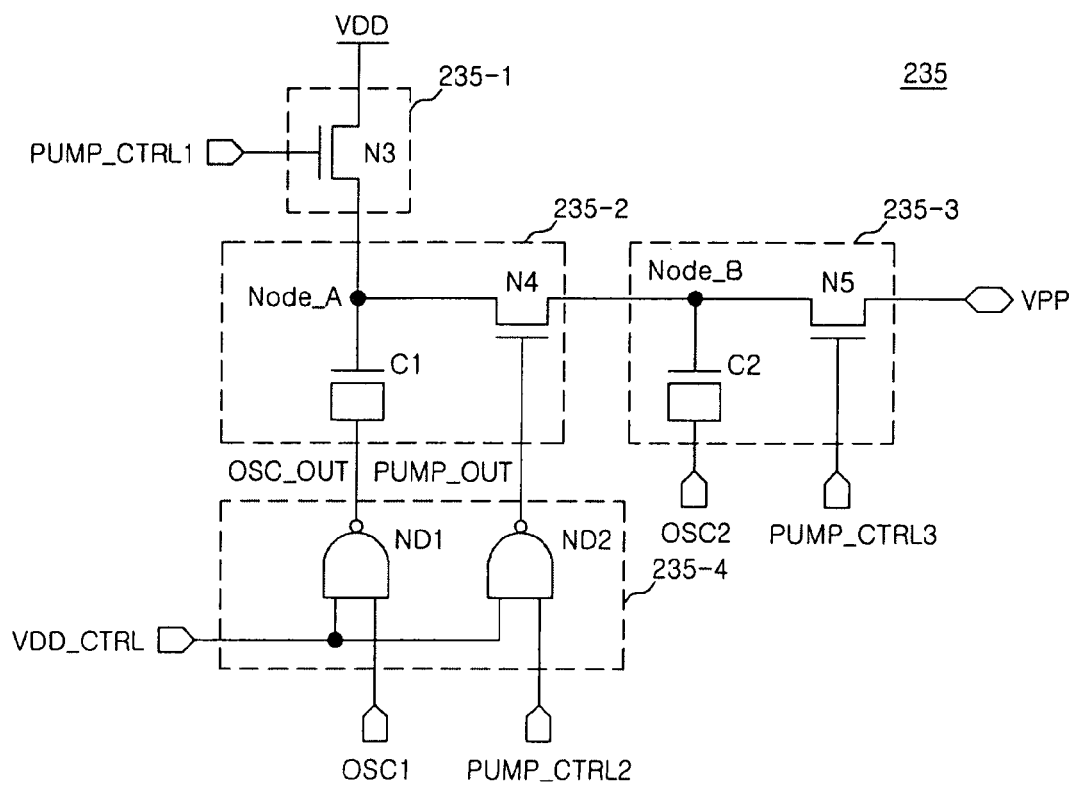
FIG. 6 is a circuit diagram illustrating a pumping unit shown in FIG. 5.

Referring to FIG. 6, the pumping unit 235 may include a voltage supplying unit 235-1, a first pump 235-2, a second pump 235-3, and a pumping control unit 235-4.

The voltage supplying unit 235-1 supplies the external voltage VDD to a first node Node_A in response to a first pumping control signal PUMP_CTRL1. The first pump 235-2 pumps up the potential of the first node Node_A in response to a second pumping control signal PUMP_CTRL2 and the first oscillation signal OSC1 and transmits the potential of the first node Node_A to a second node Node_B. The second pump 235-3 pumps up the potential of the second node Node_B in response to a third pumping control signal PUMP_CTRL3 and the second oscillation signal OSC2 and transmits the potential of the second node Node_B to the high-level voltage output terminal Node_OUT. The pumping control unit 235-4 controls a pumping operation of the first pump 235-2 or the second pump 235-3 in response to the voltage control signal VDD_CTRL, and adjusts the boosted level of the external voltage VDD.

The first pumping control signal PUMP_CTRL1, the second pumping control signal PUMP_CTRL2, and the third pumping control signal PUMP_CTRL3 are generated inside the memory apparatus in order to control the generation of the high-level voltage VPP and have different active timings.

In this embodiment, the pumping unit 235 includes the first pump 235-2 and the second pump 235-3, and the pumping control unit 235-4 controls the pumping operation of the first pump 235-2 to control the pumped level of the external voltage VDD. However, the invention is not limited thereto. For example, the pumping unit 235 may include additional pumps to further pump up the output voltage of the second pump 235-2, and the pumping control unit 235-4 may control the pumping operation of the second pump 235-3.

The voltage supplying unit 235-1 may be composed of a third NMOS transistor N3 having a gate to which the first pumping control signal PUMP_CTRL1 is input, a drain supplied with the external voltage VDD, and a source connected to the first node Node_A.

The first pump 235-2 includes a fourth NMOS transistor N4 and a first capacitor C1 for pumping up the potential of the first node Node_A in response to a first output signal OSC_OUT of the pumping control unit 235-4. The fourth NMOS transistor N4 may have a gate to which a second output signal PUMP_OUT of the pumping control unit 235-4 is input, a drain connected to the first node Node_A, and a source connected to the second node Node_B.

The second pump 235-3 may include a fifth NMOS transistor N5 and a second capacitor C2 that receives the second oscillation signal OSC2 and is connected to the second node Node_B. The fifth NMOS transistor N5 has a gate to which the third pumping control signal PUMP_CTRL3 is input, a drain connected to the second node Node_B, and a source connected to the high-level voltage output terminal Node_OUT (VPP).

The pumping control unit 235-4 includes first and second NAND gates ND1 and ND2. The first NAND gate ND1 receives the first oscillation signal OSC1 and the voltage control signal VDD_CTRL through first and second input terminals, respectively, to output the first output signal OSC_OUT. The second NAND gate ND2 receives the second pumping control signal PUMP_CTRL2 and the voltage control signal VDD_CTRL through first and second input terminals, respectively, to output the second output signal PUMP_OUT.

Next, the operation of the combo semiconductor memory apparatus according to this embodiment will be described according to either the external voltage VDD is the first external voltage VDD1 or the external voltage VDD is the second external voltage VDD2.

First, when the external voltage VDD is the first external voltage VDD1, the signal generator 100 identifies the external voltage VDD to output a high-level voltage control signal VDD_CTRL. The voltage generator 200 pumps up the level of the first external voltage VDD1 in response to the voltage control signal VDD_CTRL, to output the pumped first external voltage VDD1 to the high-level voltage output terminal Node_OUT.

When the power-up signal PW_UP is at a low level, the level of a node between the fuse 110 and the first NMOS transistor N1 is initialized to a low level by the inverting unit IV1 and the first NMOS transistor N1 in the signal generator 100.

Then, when the power-up signal PW_UP changes to a high level and the fuse 110 is blown, the input potential of the second inverting unit IV2 is maintained at a low level by the second NMOS transistor N2, so that a high-level voltage control signal VDD_CTRL is output from the second inverting unit IV2 in the signal generating unit 100.

Meanwhile, when the signal generator 100 is used as the MRS or the EMRS, the signal generator 100 outputs high-level addresses existing as extra codes for the MRS or the EMRS. Therefore, the voltage control signal VDD_CTRL is maintained at a high level.

Referring to FIG. 4, the voltage supply control unit 210 turns off all the PMOS transistors P1 in response to the high-level voltage control signal VDD_CTRL. Then, the supply of the first external voltage VDD1 to the high-level voltage output terminal Node_OUT is cut off.

Referring to FIG. 5, the level sensor 231 of the high-level voltage generating unit 230 senses the level of the high-level voltage VPP generated by the high-level voltage generating unit 230 and compares the sensed high-level voltage VPP with the reference voltage VREF. When the high-level voltage VPP is lower than a predetermined target high-level voltage, the level sensor 231 supplies the oscillator enable signal OSC_EN to the oscillator 233. Then, the oscillator 233 outputs the oscillation signals OSC1 and OSC2 in response to the oscillator enable signal OSC_EN. The pumping unit 235 pumps up the first external voltage VDD1 three times in response to the oscillation signals OSC1 and OSC2 and the voltage control signal VDD_CTRL to output the pumped voltage to the high-level voltage output terminal Node_OUT. The pumping unit 235 repeatedly performs this operation.

Referring to FIG. 6, the first pumping control signal PUMP_CTRL1 turns on the third NMOS transistor N3 forming the voltage supplying unit 235-1 to supply the first external voltage VDD1 to the first node Node_A. At this point, the pumping control unit 235-4 controls the pumping operation of the first pump 235-2 in response to the voltage control signal VDD_CTRL. More specifically, when a high-level voltage control signal VDD_CTRL is applied to the first NAND gate ND1 of the pumping control unit 235-4, the first NAND gate ND1 outputs the first output signal OSC_OUT toggled according to the first oscillation signal OSC1. Similar to the first NAND gate ND1, when a high-level voltage control signal VDD_CTRL is applied to the second NAND gate ND2 of the pumping control unit 235-4, the second NAND gate ND2 outputs the second output signal PUMP_OUT in response to the second pumping control signal PUMP_CTRL2. In this way, the potential of the first node Node_A is transmitted to the second node Node_B.

The second pump 235-3 pumps up the potential of the second node Node_B in response to the second oscillation signal OSC2 and the third pumping control signal PUMP_CTRL3.

When the external voltage VDD is the first external voltage VDD1, the pumping unit 235 increases the level of the first external voltage VDD1 three times. The pumping unit 235 repeats the pumping operation to further increase the level of the external voltage VDD.

On the other hand, when the external voltage VDD is the second external voltage VDD2, the signal generator 100 identifies the level of the external voltage VDD to output a low-level voltage control signal VDD_CTRL. The voltage generator 200 outputs the second external voltage VDD2 directly to the high-level voltage output terminal Node_OUT in response to the voltage control signal VDD_CTRL. When the second external voltage VDD is lowered, the voltage generator 200 pumps up the second external voltage VDD2 to keep the high-level voltage VPP at a target level.

As shown in FIG. 2, when the power-up signal PW_UP is at a low level, the first NMOS transistor N1 is turned on to initialize the level of a node between the fuse 110 and the first NMOS transistor N1 to a low level.

Then, when the power-up signal PW_UP changes to a high level, the fuse 110 is not blown, and the potentials of the drains of the first and second NMOS transistors N1 and N2 are at a high level, so that the first and second NMOS transistors N1 and N2 are turned off, resulting in a low-level voltage control signal VDD_CTRL.

Meanwhile, when the MRS or the EMRS is used as the signal generator 100, the signal generator 100 outputs low-level addresses existing as extra codes for the MRS or the EMRS. Therefore, the voltage control signal VDD_CTRL is maintained at a low level.

As shown in FIG. 4, the voltage supply control unit 210 turns on all the PMOS transistors P1 in response to the low-level voltage control signal VDD_CTRL to control the operation of a plurality of metal switches 213-1 (SW_M), which makes it possible to adjust the amount of current supplied from the external voltage terminal VDD to the high-level voltage output terminal Node_OUT and thus control driving force for the high-level voltage VPP. That is, the voltage supply control unit 210 outputs the second external voltage VDD2 directly to the high-level voltage output terminal Node_OUT in response to the voltage control signal VDD_CTRL.

When the level of the second external voltage VDD2 supplied to the high-level voltage output terminal Node_OUT is lowered, the level sensor 231 of the high-level voltage generating unit 230 shown in FIG. 5 senses the level of the high-level voltage VPP, activates the oscillator enable signal OSC_EN, to output the activated signal. Then, the oscillator 233 outputs the oscillation signals OSC1 and OSC2. The pumping unit 235 pumps up the second external voltage VDD2 two times in response to the oscillation signals OSC1 and OSC2 and the voltage control signal VDD_CTRL and outputs the pumped voltage to the high-level voltage output terminal Node_OUT. The pumping unit 235 repeatedly performs this operation.

When the external voltage VDD is the second external voltage VDD2, that is, the high-level voltage VPP is lowered, the high-level voltage generating unit 230 keeps the high-level voltage VPP at a target level.

The first pumping control signal PUMP_CTRL1 turns on the voltage supplying unit 235-1 of the pumping unit 235 to supply the second external voltage VDD2 to the first node Node_A. The pumping control unit 235-4 controls the pumping operation of the first pump 235-2 in response to the voltage control signal VDD_CTRL. More specifically, the first NAND gate ND1 of the pumping control unit 235-4 outputs the first output signal OSC_OUT at a high level, in response to the low-level voltage control signal VDD_CTRL and the first oscillation signal OSC1, to control the first pump 235-2 not to perform the pumping operation. The second NAND gate ND2 outputs the second output signal PUMP_OUT in response to the low-level voltage control signal VDD_CTRL and the second pumping control signal PUMP_CTRL2. In this way, the potential of the first node Node_A is transmitted to the second node Node_B.

The second pump 235-3 pumps up the potential of the second node Node_B for charge sharing with the high-level voltage VPP, in response to the second oscillation signal OSC2 and the third pumping control signal PUMP_CTRL3.

When the external voltage VDD is the second external voltage VDD2, the pumping unit 235 pumps up the level of the second external voltage VDD2 two times. The pumping unit 235 repeats the pumping operation to maintain the level of the high-level voltage VPP.

That is, when the external voltage VDD is the first external voltage VDD1, the pumping unit 235 increases the level of the first external voltage VDD1 three times through one pumping operation. When the external voltage VDD is the second external voltage VDD2, the pumping unit 235 increases the level of the second external voltage VDD2 two times through one pumping operation.

In this embodiment, the pumping unit 235 can adjust the boost ratio of the external voltage VDD according to the level of the external voltage VDD. Therefore, the pumping unit 235 can adjust the pumping ratio of the external voltage VDD to the high-level voltage VPP.

As described above, the semiconductor memory apparatus according to this embodiment of the present invention pumps up the external voltage VDD or outputs the external voltage VDD to the high-level voltage output terminal Node_OUT without any change according to the level of the external voltage VDD applied to generate the high-level voltage VPP, which makes it possible to reduce current consumption.

Further, the semiconductor memory apparatus according to the above-described embodiment of the present invention can operate in response to various types of external voltages VDD.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The semiconductor memory apparatus according to the above-described embodiment of the invention can reduce current consumption of a semiconductor memory to improve the operational characteristics of the memory. In addition, according to the above-described embodiment of the invention, it is possible to develop various types of products that can be used for different types of external power sources and design a product that can be used for different types of external power sources, which makes it possible to reduce the costs of developing products.

What is claimed is:

1. A semiconductor integrated circuit comprising:
a signal generator configured to generate a voltage control signal according to a level of an external voltage; and
a voltage generator configured to receive the voltage control signal and to pump up the level of the external voltage to output a pumped voltage to a high-level voltage output terminal when the voltage control signal is a first level, and to directly supply the external voltage to the high-level voltage output terminal when the voltage control signal is a second level.

2. The semiconductor integrated circuit of claim 1, wherein the signal generator is a mode register set or an extended mode register set.

3. The semiconductor integrated circuit of claim 1, wherein the signal generator includes:
a fuse to which the external voltage is applied; and
a signal driving unit that outputs the external voltage transmitted through the fuse as the voltage control signal in response to a power-up signal.

4. The semiconductor integrated circuit of claim 3, wherein the signal driving unit includes:
a first NMOS transistor that has a gate to which an inverted power-up signal is input, a drain connected to the fuse, and a source connected to a ground voltage terminal; and
a second NMOS transistor that has a gate to which the voltage control signal is input, a drain connected to the fuse, and a source connected to the ground voltage terminal.

5. The semiconductor integrated circuit of claim 1, wherein the voltage generator includes:
a voltage supply control unit that controls a supply of the external voltage to the high-level voltage output terminal in response to the voltage control signal; and
a high-level voltage generating unit that determines a pumping ratio of the external voltage in response to the voltage control signal and pumps up the external voltage on the basis of the pumping ratio, to output the pumped voltage to the high-level voltage output terminal.

6. The semiconductor integrated circuit of claim 5, wherein the voltage supply control unit includes a switching unit that supplies the external voltage to the high-level voltage output terminal in response to the voltage control signal.

7. The semiconductor integrated circuit of claim 6, wherein the switching unit includes transistors each having a gate to which the voltage control signal is input, a drain supplied with the external voltage, and a source connected to the high-level voltage output terminal.

8. The semiconductor integrated circuit of claim 6, wherein the voltage supply control unit further includes a current adjusting unit that adjusts an amount of current supplied from an external voltage terminal to the high-level voltage output terminal.

9. The semiconductor integrated circuit of claim 8, wherein the current adjusting unit includes switching elements connected between the external voltage terminal and the switching unit.

10. The semiconductor integrated circuit of claim 9, wherein the switching elements are metal switches.

11. The semiconductor integrated circuit of claim 5, wherein the high-level voltage generating unit includes:
a level sensor that senses a voltage at the high-level voltage output terminal and generates an oscillator enable signal on the basis of a result of the sensing;
an oscillator that outputs an oscillation signal in response to the oscillator enable signal; and
a pumping unit that determines a boost ratio of the external voltage in response to the oscillation signal and the voltage control signal and pumps up the level of the external voltage on the basis of the boost ratio.

12. The semiconductor integrated circuit of claim 11, wherein the pumping unit is a doubler or a tripler.

13. The semiconductor integrated circuit of claim 11, wherein the oscillation signal includes a first oscillation signal and a second oscillation signal having different active timings, and
wherein the pumping unit includes:
a voltage supplying unit that supplies the external voltage to a first node in response to a first pumping control signal;
a first pump that pumps up a potential of the first node in response to a second pumping control signal and the first oscillation signal to transmit the potential of the first node to a second node;
a second pump that pumps up a potential of the second node in response to a third pumping control signal and the second oscillation signal to transmit the potential of the second node to the high-level voltage output terminal; and
a pumping control unit that controls the pumping operation of the first pump or the second pump in response to the voltage control signal to adjust the boost ratio of the external voltage.

14. The semiconductor integrated circuit of claim 13, wherein the voltage supplying unit is a switching element that operates in response to the first pumping control signal.

* * * * *